United States Patent [19]

Miller et al.

[11] Patent Number: 4,649,629
[45] Date of Patent: Mar. 17, 1987

[54] METHOD OF LATE PROGRAMMING A READ ONLY MEMORY

[75] Inventors: Robert O. Miller, The Colony; Dale A. Simpson, Lewisville, both of Tex.

[73] Assignee: Thomson Components - Mostek Corp., Carrolton, Tex.

[21] Appl. No.: 760,206

[22] Filed: Jul. 29, 1985

[51] Int. Cl.[4] .................... H01L 21/265; B01J 17/00; G11C 11/40
[52] U.S. Cl. .................................. 29/576 B; 29/571; 148/1.5; 148/187; 148/DIG. 82; 357/23.6; 357/91
[58] Field of Search ............... 29/571, 576 B; 148/1.5, 148/187; 357/23, 91

[56] References Cited

U.S. PATENT DOCUMENTS

| | | | |
|---|---|---|---|
| 4,376,947 | 3/1983 | Chiu et al. | 357/23 |
| 4,406,049 | 9/1983 | Tam et al. | 29/571 |
| 4,419,809 | 12/1983 | Riseman et al. | 29/571 |
| 4,455,742 | 6/1984 | Williams et al. | 29/576 B |
| 4,472,871 | 9/1984 | Green et al. | 29/576 B |
| 4,488,351 | 12/1984 | Momose | 29/578 |
| 4,513,494 | 4/1985 | Batra | 29/576 B |
| 4,536,944 | 8/1985 | Bracco et al. | 29/571 |
| 4,545,110 | 10/1985 | Maas et al. | 29/571 |
| 4,590,665 | 5/1986 | Owens et al. | 29/571 |

OTHER PUBLICATIONS

Ohkura et al., IEEE Trans. Electron Devices, ED-26, (1979) 430.
Dill et al., Radiation Effects, 7 (1971) 45.

Primary Examiner—Upendra Roy
Attorney, Agent, or Firm—Roland Plottel

[57] ABSTRACT

Transistors (10) having lateral gaps between their source and drain and the gate are interconnected in a ROM to receive program code.

In one embodiment of the invention (FIG. 3), the gaps of selected transistors (42) are subjected to a phosphorous implant (44) to create lightly doped n− regions (26,28) connecting the source (18) and drain (20) to the gate (14), and function normally. The other transistors (40) do not receive the phosphorous implant, and thus have a higher threshold voltage.

In another embodiment of the invention (FIG. 2) all of the transistors receive the phosphorous implant to create the n− regions (26,28) connecting the source and drain to the gate, and the n− regions of selected transistors (32) are counter-doped with a boron implant (34) so as to raise their threshold voltages, while the other transistors (30) are not counter-doped and function normally.

In both embodiments, programming can occur late in the processing of the ROM.

3 Claims, 3 Drawing Figures

METHOD OF LATE PROGRAMMING A READ ONLY MEMORY

CROSS REFERENCE TO RELATED APPLICATIONS

Cross reference is made herein to copending, commonly-owned U.S. Pat. No. 4,599,118, application Ser. No. 335,608, entitled TRIPLE DIFFUSED SHORT CHANNEL DEVICE STRUCTURE, filed on even date herewith by Y. P. Han and T. C. Chan.

TECHNICAL FIELD OF THE INVENTION

The invention relates to the manufacture and programming of semiconductor Read Only Memories (ROM'S).

BACKGROUND OF THE INVENTION

For faster turnaround of ROM's, there is a need to program them as late in the fabrication sequence as possible, so that few (if any) process steps separate the unprogrammed chip from shipment.

Generally, two types of late programming are employed, post-poly (polycrystalline silicon) and post-metal. Both techniques usually rely on high-energy ion implantation, of boron for example, to increase the boron doping concentration in the channel region beneath the gate so as to render the gate threshold voltage of selected transistors sufficiently high so that they will not turn on. The configuration of the selected transistors corresponds to the ROM program code.

The aforementioned ion implantation must be done at a sufficiently high energy to put the peak of the as-implanted profile under the oxide/channel interface, which means that the boron must get through the gate oxide, poly gate, and whatever films are, at that point, on top of the polysilicon. There are three reasons why the peak must get that far:

a. The as-implanted distribution drops off from its peak concentration so rapidly that an impractically longer implantation time would be required to bring a far-side tail concentration up to the needed value.

b. It is undesirable, with the doses involved, to leave the majority of the dopant back in the gate oxide and/or poly.

c. Small variations in thicknesses of barrier films cause larger variations in concentration of the tail distribution than near the peak (center).

In post-poly programming, the wafers have patterned poly gates, a mask is used to open up selected transistors, and the high energy ion implantation is performed. In the subsequent process steps, the implanted boron sees high enough temperatures to effect nearly 100 percent substitution and lattice annealing, but these process steps add to the turn-around time.

Commonly-owned U.S. Pat. No. 4,356,042 (Gedaly, 1982) and U.S. Pat. Nos. 4,333,164 (Orikabe et al, 1982) and 4,208,727 (Redwine et al., 1980) are typical of the post-poly techniques.

In post-metal programming, the wafers have patterned metal interconnections, a mask is used to open up selected transistors, the metal-to-poly dielectric is etched back to a small thickness over these transistors, and the high-energy ion implantation is performed. The highest subsequent temperature seen by the wafer is 425° C., which is not enough to activate the boron beyond its expected 25 percent (or so) as-implemented substitutional percentage, and, in fact, may deactivate some of the already substituted boron. Consequently, the dose used is five to ten times higher than in the post-poly programming case, and results in a rather wide threshold range and high degree of unannealed damage. The advantage, of course, is that only a minimal amount of processing remains to be done after programming. The yield, however, is historically and understandably lower than in the post-poly case.

U.S. Pat. No. 4,390,971 (Kuo, 1983) describes a typical post-metal programming technique. The ROM array is programmed by first depositing the post-metal-oxide or protective oxide layer 21 over the entire slice, then patterning it by a photoresist mask and etch sequence using a unique mask which defines the ROM code. An aperture 22 is defined over each cell 10 to be programmed as a "0", and each cell 10 to be a "1" is left covered. The slice is then subjected to a boron implant of about 180 Kev to a dosage of about $10^{13}$ ions per sq. cm. The energy level and dosage are dependent upon the thickness of the oxide layer 19 and the polysilicon gates 11, as well as the change in threshold desired. At this level, the ion implant penetrates the polycrystalline silicon gate 11 and gate oxide 19 to create an implanted region 23 in the channel area. This implant raises the threshold voltage above 5 V. Since the part operates on a supply voltage Vdd of 5 V., the full logic 1 level will not turn on the transistor. The transistors covered by the oxide 21 will not be implanted so will retain the usual threshold voltage of about 0.8 V. U.S. Pat. No. 4,198,693 (Kuo, 1980) describes a similar process for a VMOS ROM. Somewhat less voltage is required when the metal over the gates has been removed, as discussed in U.S. Pat. No. 4,342,100 (Kuo, 1982). Even less voltage may be required when the implant is performed prior to metalization (forming contacts and interconnects), as described in U.S. Pat. Nos. 4,364,167 (Donley, 1982) and 4,295,209 (Donley, 1981).

In both post-poly and post-metal boron implant type late programming, the high-energy ion implantation can have yield degrading effects.

DISCLOSURE OF THE INVENTION

Therefore, it is an object of this invention to provide an improved technique for ROM programming, late in the process, which requires less implant voltage than the above-described techniques.

According to the invention, transistors having lateral gaps between their source and drain and the gate are interconnected in a ROM to receive program code.

In one embodiment of the invention (FIG. 3), the gaps of selected transistors are subjected to a phosphorous implant to create lightly doped n− regions connecting the source and drain to the gate, and function normally. The other transistors do not receive the phosphorous implant, and thus have a higher threshold voltage.

In another embodiment of the invention (FIG. 2) all of the transistors receive the phosphorous implant to create the n− regions connecting the source and drain to the gate, and the n− regions of selected transistors are counter-doped with a boron implant so as to raise their threshold voltages, while the other transistors are not counter-doped and function normally.

In both embodiments, programming can occur late in the processing of the ROM.

Other objects, features, and advantages of the invention will become apparent in light of the following

BEST MODE FOR CARRYING OUT THE INVENTION

Figure 1:
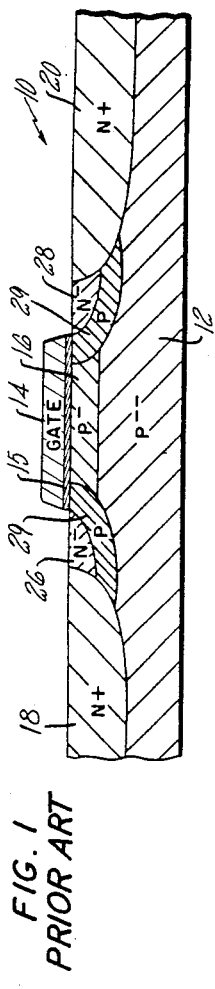
FIG. 1 is a cross-sectional view of a prior art transistor.

FIG. 1 illustrates one FET device 10 of a large scale integrated circuit. The substrate 12 of the device is a silicon material lightly doped with a P-type material, such as boron, and designated as a P— — region. A gate 14 is separated from the silicon substrate 12 by a layer of silicon dioxide 15. A channel region 16 above the P— — region 12 and below the gate 14 is slightly more heavily doped with a P-type material than the substrate 12 and is designated as a P-region.

A source 18 and drain 20 are formed by heavily doping regions of the substrate 12 on opposite sides of the gate 14 with an N-type material and designated as an N+ region.

Lateral gaps exist between each of the source and drain and the gate. To connect the source and drain to the gate, the gaps are electrically closed by a blanket, low-dose phosphorous implant, resulting in n− gap regions 26 and 28 respectively. (Although the n− implant may extend over the source and drain, it is only the n− implant in the gaps that is germane to the invention, as described hereinafter). Additionally, boron-doped "halo" regions 29 are doped with P-type material in a greater concentration than the channel region, and extend around the n− gap regions 26 and 28 to improve short-channel characteristics and to support shallow punchthrough and $V_T$ falloff.

The above-described process is described in greater detail in copending, commonly-owned U.S. Pat. No. 4,599,118, application Ser. No. 335,608, filed on Dec. 30, 1981 by Y. P. Han and Chan and entitled TRIPLE DIFFUSED SHORT CHANNEL DEVICE STRUCTURE.

Figure 2:
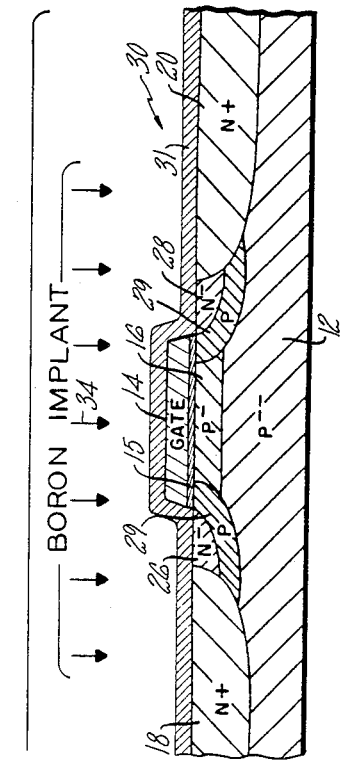
FIG. 2 is a cross-sectional view of one embodiment of the invention.
Figure 2:
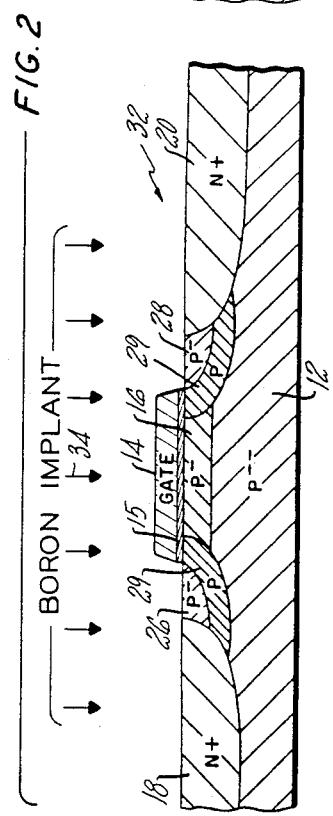

In one embodiment of the invention, as shown in FIG. 2, a transistor 30 is masked by a layer of photoresist 31, and a transistor 32 is not. (The transistors 30 and 32 are of the type shown in FIG. 1.) The substrate is then subjected to a low-energy, low-dose boron implant, as indicated by arrows 34. In the unmasked transistor 32, the n− regions 26 and 28 are compensated by the boron implant 34 so as to change said regions to P-type (as indicated), thereby resulting in an abnormally high threshold voltage in the transistor 32. The transistor 30 is shielded from the boron implant by the photoresist, which is later removed, so as to function in a normal manner. (The transistor 30 is identical to the transistor 10.) This sequence allows the program code to be installed very late in the processing sequence, in some cases even after metal interconnections are made.

The energy of the boron implant 34 is on the order of 50 to 75 Kev since it need only compensate the shallow n− gap regions 26 and 28. Furthermore, the dose of the boron implant may be low, on the order of $10^{14}$ ions per sq. cm., since the n− gap region is only lightly dosed with phosphorous initially. (The dose is conveniently low so that an overdose error would not result in the formation of a zener n+/p+ junction between the source and drain). A benefit of this embodiment is that the boron counter-implant increases the "halo" 29 doping which further negates short channel effects. A further benefit of this embodiment is that the boron counter-implant causes the P-type concentration at the upper surface of the "halo" region to be sufficiently high to prevent threshold instability due to charge accumulation at said surface.

Figure 3:
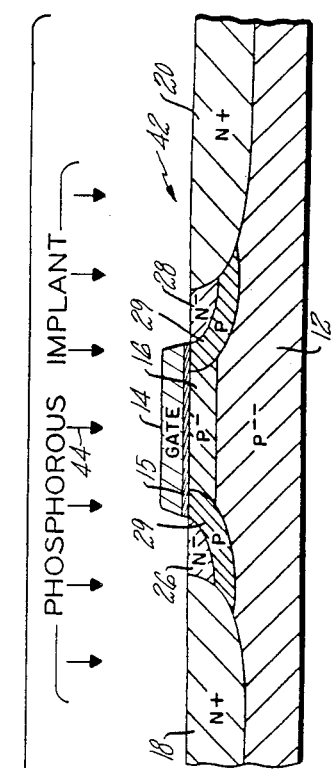
FIG. 3 is a cross-sectional view of another embodiment of the invention.
Figure 3:
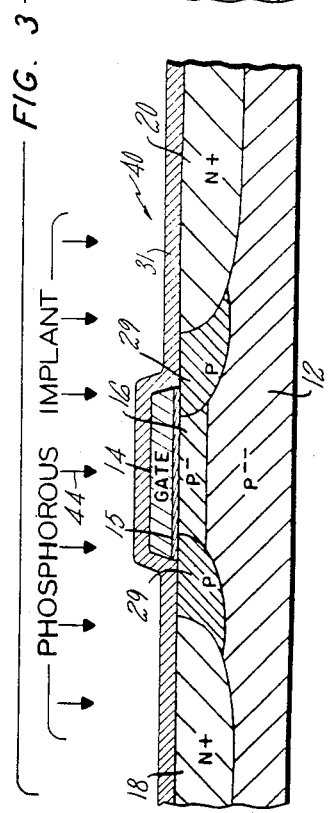

In an alternate embodiment of the invention, as shown in FIG. 3, a transistor 40 is masked by a layer of photoresist 41 and a transistor 42 is not. (Except as described hereinafter, the transistors 40 and 42 are of the type shown in FIG. 1.) The photoresist mask is applied to selected transistors 40 prior to the aforementioned blanket, low-dose n− (phosphorous) implant, as indicated by the arrows 44. Therefore, the masked transistor 40 will not have the n− regions 26 and 28 connecting the source and drain to the gate, resulting in an extremely high threshold voltage. The unmasked transistor 42 receives the phosphorous implant which forms the connective n− gap regions 26 and 28 and functions in a normal manner. (The transistor 42 is identical to the transistor 10.)

Typically, in the embodiments of FIG. 2 and FIG. 3 the transistor having the normal threshold voltage (i.e., the transistors 30 and 42) would be indicative of logic ONE, and the transistor having the elevated threshold voltage (i.e., the transistors 32 and 40) would be indicative of logic ZERO in the program code.

It should be understood that various changes may be made to the invention without departing from the spirit and scope thereof.

We claim:

1. A method of ROM manufacture copmprising the sequential steps of:

forming in a common substrate a plurality of transistors, each including first and second regions of one conductivity type spaced apart by an intermediate region of the opposite conductivity type, each of the first and second regions including a more heavily doped main portion and a less heavily doped lateral gap portion, said gap portion lying between the main portion and the intermediate region, and a gate electrode overlying the surface portion of the intermediate region and not overlying the gap portion of the first and second regions, masking selected transistors according to a desired programming code, and subjecting the plurality of transistors to an implant of ions of the type characteristic of said opposite conductivity type sufficient to convert said gap portions of the first and second regions of the unmasked transistors to said opposite conductivity type, whereby said unmasked transistors are effectively disabled.

2. The method of claim 1, in which the transistors are initially formed so that in each transistor the intermediate region of opposite conductivity type includes halo portions of higher doping of the like conductivity type which underlie the gap portions of the first and second regions and said ion implant is sufficient to convert essentially entirely the gap portions overlying said halo regions of the unmasked transistors to said opposite conductivity type.

3. The method of claim 1, in which the first and second regions are n-type, the intermediate region p-type and the implant is of boron ions.

* * * * *